United States Patent [19]

Kaya et al.

[11] Patent Number: 5,130,267
[45] Date of Patent: Jul. 14, 1992

[54] SPLIT METAL PLATE CAPACITOR AND METHOD FOR MAKING THE SAME

[75] Inventors: Cetin Kaya, Dallas; Howard L. Tigelaar, Allen, both of Tex.

[73] Assignee: Texas Instruments Incorporated, Dallas, Tex.

[21] Appl. No.: 784,097

[22] Filed: Oct. 28, 1991

Related U.S. Application Data

[63] Continuation of Ser. No. 355,941, May 23, 1989, abandoned.

[51] Int. Cl.$^5$ .................................... H01L 21/70
[52] U.S. Cl. .................................... 437/47; 437/60; 437/192; 437/200; 437/919
[58] Field of Search ............. 437/47, 48, 52, 60, 437/187, 200, 192, 201, 919, 245, 228, 233, 235, 238; 357/23.6, 51; 361/301, 304, 311

[56] References Cited

U.S. PATENT DOCUMENTS

| | | | |
|---|---|---|---|
| 4,372,034 | 2/1983 | Bohr | 437/228 |
| 4,410,867 | 10/1983 | Arcidiacono et al. | 361/311 |
| 4,419,812 | 12/1983 | Topich | 357/51 |
| 4,443,930 | 4/1984 | Hwang et al. | 437/200 |
| 4,466,177 | 8/1984 | Chao | 357/51 |
| 4,472,726 | 9/1984 | DiMaria et al. | 357/23.6 |
| 4,505,026 | 3/1985 | Bohr et al. | 437/228 |
| 4,536,949 | 8/1985 | Takayama et al. | 437/228 |
| 4,543,707 | 10/1985 | Ito et al. | 437/228 |
| 4,560,436 | 12/1985 | Bukchman et al. | 437/228 |
| 4,577,390 | 3/1986 | Haken | 437/47 |
| 4,581,815 | 4/1986 | Cheung et al. | 437/200 |
| 4,582,745 | 4/1986 | Schnable | 437/982 |
| 4,589,056 | 5/1986 | Stimmell | 361/311 |
| 4,614,666 | 9/1986 | Lindenfelser | 437/228 |
| 4,628,405 | 12/1986 | Lippert | 361/321 |
| 4,630,086 | 12/1986 | Sato et al. | 357/23.6 |
| 4,638,400 | 1/1987 | Brown et al. | 361/304 |
| 4,676,866 | 6/1987 | Tang et al. | 437/200 |
| 4,700,457 | 10/1987 | Matsukawa | 437/52 |
| 4,721,548 | 1/1988 | Morimoto | 437/235 |
| 4,732,872 | 3/1988 | Komatsu | 437/47 |
| 4,760,034 | 7/1988 | Barden | |
| 4,768,080 | 8/1988 | Sato | 357/54 |
| 4,931,411 | 6/1990 | Tigelaar | 437/200 |
| 4,997,794 | 5/1991 | Josquin et al. | 437/919 |
| 5,006,480 | 4/1991 | Chang et al. | 437/919 |

FOREIGN PATENT DOCUMENTS

| | | |
|---|---|---|
| 0235751 | 5/1986 | German Democratic Rep. |
| 60-148168 | 8/1985 | Japan |
| 0094664 | 4/1988 | Japan |

OTHER PUBLICATIONS

Ghandhi, "VLSI Fabrication Principles", John Wiley, 1983 pp. 420-430.
Wolf, "Silicon Processing for the VLSI Era" Lattice Press, 1986 pp. 187-191.
Card, et al. "Reissue Floating-Gate Memory", *J. Appl. Phys*, vol. 44, No. 5, May 1973, pp. 2326-2330.
Jambotkar, et al., "Stacked Gate Device with Reduced 0 State Threshold Voltage", *IBM Technical Disclosure Bulletin*, vol. 22, No. 1, (1979) pp. 160-161.
D. Brown, et al., "Advanced Analog CMOS Technology", IEEE, 1985, pp. 260-263.

*Primary Examiner*—Tom Thomas
*Attorney, Agent, or Firm*—Stanton C. Braden; William E. Hiller; Richard L. Donaldson

[57] ABSTRACT

A metal-to-polysilicon capacitor, a floating-gate transistor containing such a capacitor, and a method for making the same is disclosed. The bottom plate of the capacitor is formed over a field oxide structure, and the capacitor dielectric is deposited thereover. A first metal layer, such as titanium nitride or a titanium-tungsten alloy, is formed over the capacitor dielectric, and is patterned and etched to define the top plate of the capacitor and, accordingly, the capacitor size. Multilevel dielectric is formed thereover, and a contact via to the top plate is etched therethrough. Metallization is sputtered overall, to make contact to the top plate and elsewhere in the circuit.

9 Claims, 10 Drawing Sheets

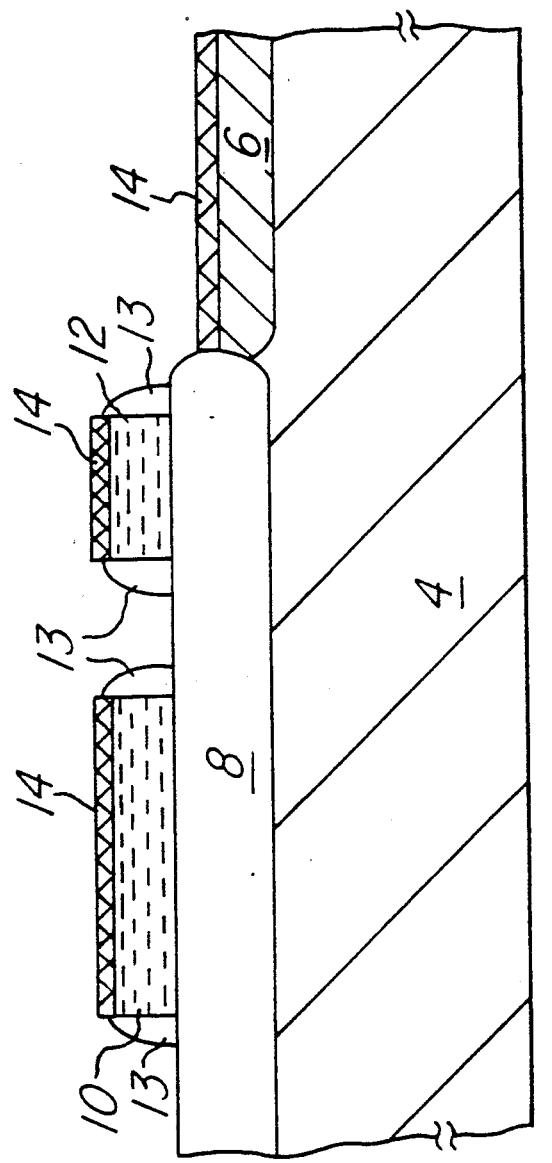

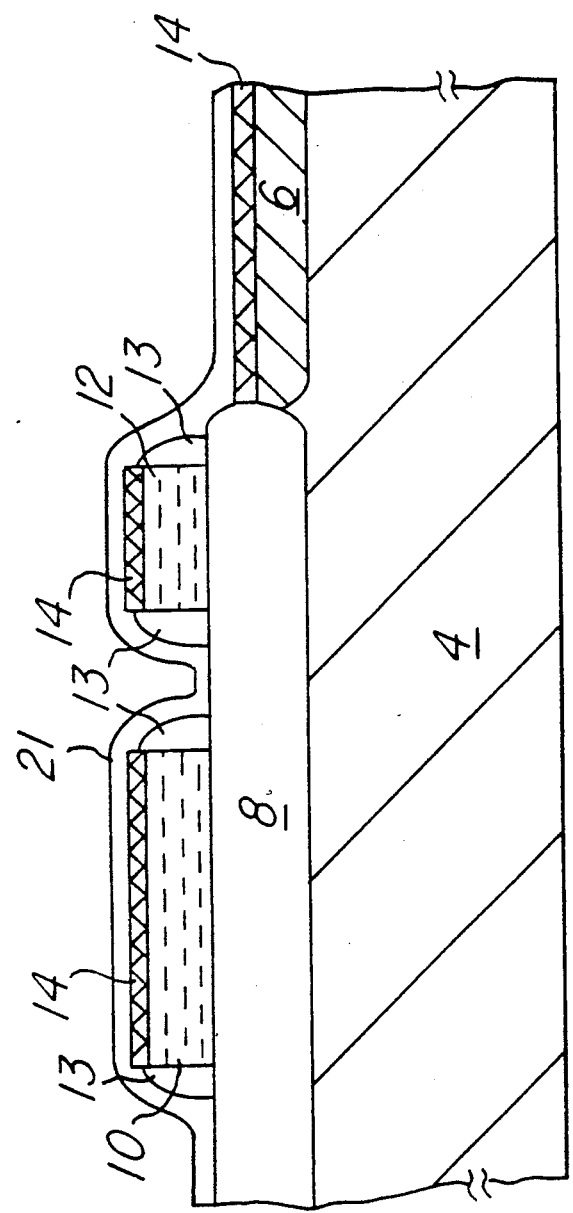

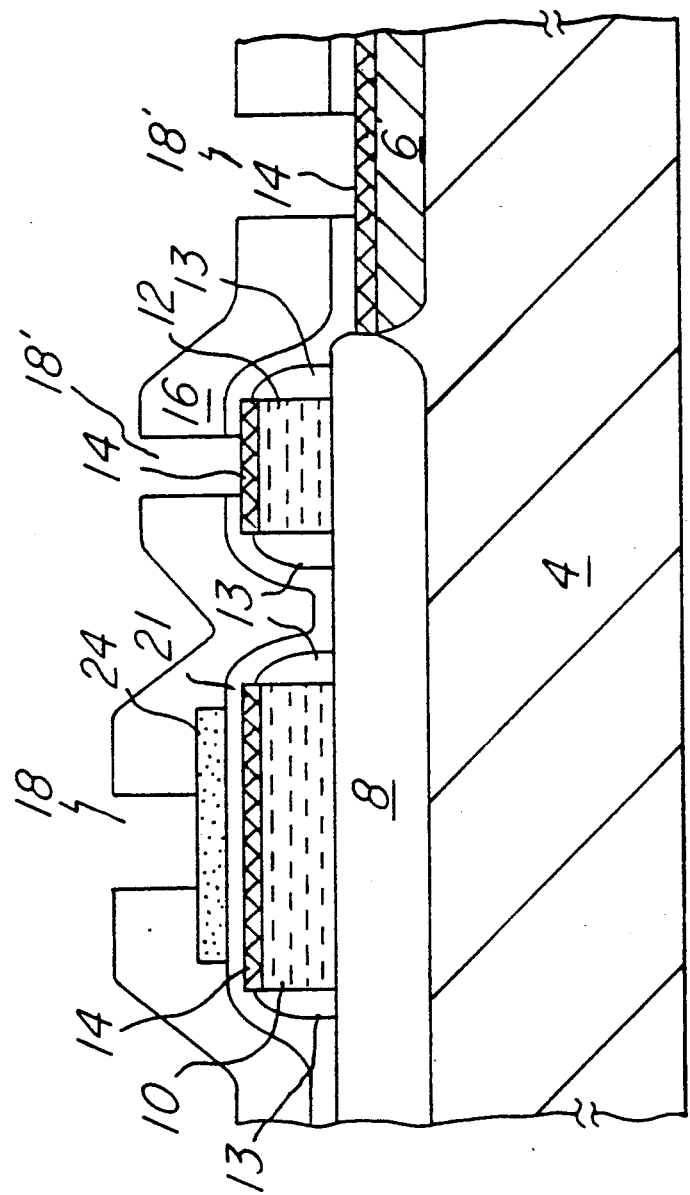

5,130,267

SPLIT METAL PLATE CAPACITOR AND METHOD FOR MAKING THE SAME

This application is a continuation of application Ser. No. 07/355,941, filed May 23, 1989 now abandoned.

This invention is in the field of integrated circuits, and is more specifically directed to the formation of capacitors in integrated circuits.

RELATED CASES

This application is related to applications Ser. No. 282,173 filed Dec. 9, 1988, now U.S. Pat. No. 4,971,924 and Ser. No. 198,930, filed May 3, 1988, now U.S. Pat. No. 4,843,903. Both applications are assigned to Texas Instruments Incorporated.

BACKGROUND OF THE INVENTION

In the field of integrated circuits, it is preferable to form circuit elements in the smallest achievable surface area, in order to realize a high degree of circuit complexity into a small integrated circuit chip size, resulting in lower cost per function. For circuits containing capacitors, such as those required in analog-to-digital converters (ADCs) and in non-volatile memories which use capacitive coupling between a control gate and a floating gate, the goal of large scale integration requires the provision of capacitors which are small in cross-sectional area but large in capacitance. Especially in the field of ADCs, the stability of the capacitance value over a range of applied voltage, and over a given temperature range, is additionally important in providing fast and accurate conversion.

Another consideration in the cost of fabricating integrated circuits is the complexity of the fabrication process. The process complexity can be increased in an attempt to save surface area by increasing the number of interconnect levels. For example, the surface area of a given integrated circuit may be reduced by using two, rather than one, levels of polysilicon gates and interconnects, under the overlying metallization layer(s). However, the process complexity is increased by including the additional polysilicon layer due to the added process steps of the deposition of an additional polysilicon layer, deposition of an additional dielectric layer, and patterning and etching the additional polysilicon layer and contacts thereto.

Furthermore, additional high temperature process steps performed after the formation of diffused junctions are detrimental to the ability to scale the transistors in an integrated circuit, as the additional high temperature steps cause the diffused dopants used in junction formation to further diffuse, resulting in deeper junctions and wider lateral diffusion.

Furthermore, it is desirable that the manufacturing process flow for the fabrication of integrated circuits such as ADCs be as compatible as possible with the manufacturing process flows for other integrated circuits such as digital logic circuits. However, large value and low voltage coefficient capacitors such as are necessary in ADCs are generally not required in modern digital logic circuits. The incorporation of a special process flow for the fabrication of such capacitors at an early stage in the process would tend to reduce the compatibility of the process for fabricating the ADC with that for fabricating the digital logic circuits.

Still furthermore, the accuracy of ADCs using capacitor arrays depends upon the matching of the capacitance ratios among the capacitors within the array. It is fundamental that the value of a capacitor is proportional to its cross-sectional area. For ADCs, therefore, increased control of the area of the integrated circuit capacitors will directly improve the accuracy of the ADC. The above-referenced copending applications, incorporated herein by this reference, provide high specific capacitance capacitors where the cross-sectional area is defined by the size of a contact via etched through a multilevel dielectric layer, due to the thickness of the multilevel dielectric, for example 1000 nm. While these capacitors can be formed quite accurately, the size of contact vias through multilevel dielectric can vary in the manufacturing process.

It is therefore an object of this invention to provide a capacitor which has a high specific capacitance which has a size which can be more accurately controlled in the fabrication process.

It is another object of this invention to provide a method of forming such a capacitor.

It is another object of this invention to provide such a method which requires relatively low temperature processing.

It is another object of this invention to provide such a method requiring only a single level of polysilicon to form the capacitor.

It is another object of this invention to provide such a capacitor having a low voltage coefficient of capacitance.

It is another object of this invention to provide such a capacitor which may be fabricated at a late stage in the manufacturing process, so that the fabrication steps of the integrated circuit prior to the formation of the capacitor may be standardized with the fabrication steps for integrated circuits not including such capacitors.

It is a further object of this invention to provide such a capacitor which may be fabricated with relatively simple contact etch processing.

Other objects and advantages of the invention will become apparent to those of ordinary skill in the art having reference to the following description, in conjunction with the drawings.

SUMMARY OF THE INVENTION

The invention may be incorporated into an integrated circuit capacitor with a polysilicon electrode as a bottom plate and a split metal layer as a top plate. Subsequent to the formation of a patterned polysilicon layer, preferably silicide clad, the capacitor dielectric is deposited thereover. A first metal layer formed of a refractory metal (such as Mo, W, or Ti), alloy (titanium:-tungsten) or compound (titanium nitride) is deposited over the capacitor dielectric. The first metal layer is patterned and etched to define the size of the metal to polysilicon/silicide capacitor. Multilevel dielectric, such as PSG or BPSG, is deposited over the first metal layer, and a contact via is etched therethrough to the first metal layer. Contacts are etched at this same time to diffusion and to polysilicon electrodes as desired. A second metal layer is then deposited and patterned to contact the top plate of the capacitor over the capacitor dielectric, and to make contact as desired to diffusion and to polysilicon.

BRIEF DESCRIPTION OF THE DRAWINGS

FIGS. 2a through 2f are cross-sectional diagrams illustrating various steps in the formation of the capacitor of FIG. 1.

DETAILED DESCRIPTION OF THE PREFERRED EMBODIMENT

Figure 1:
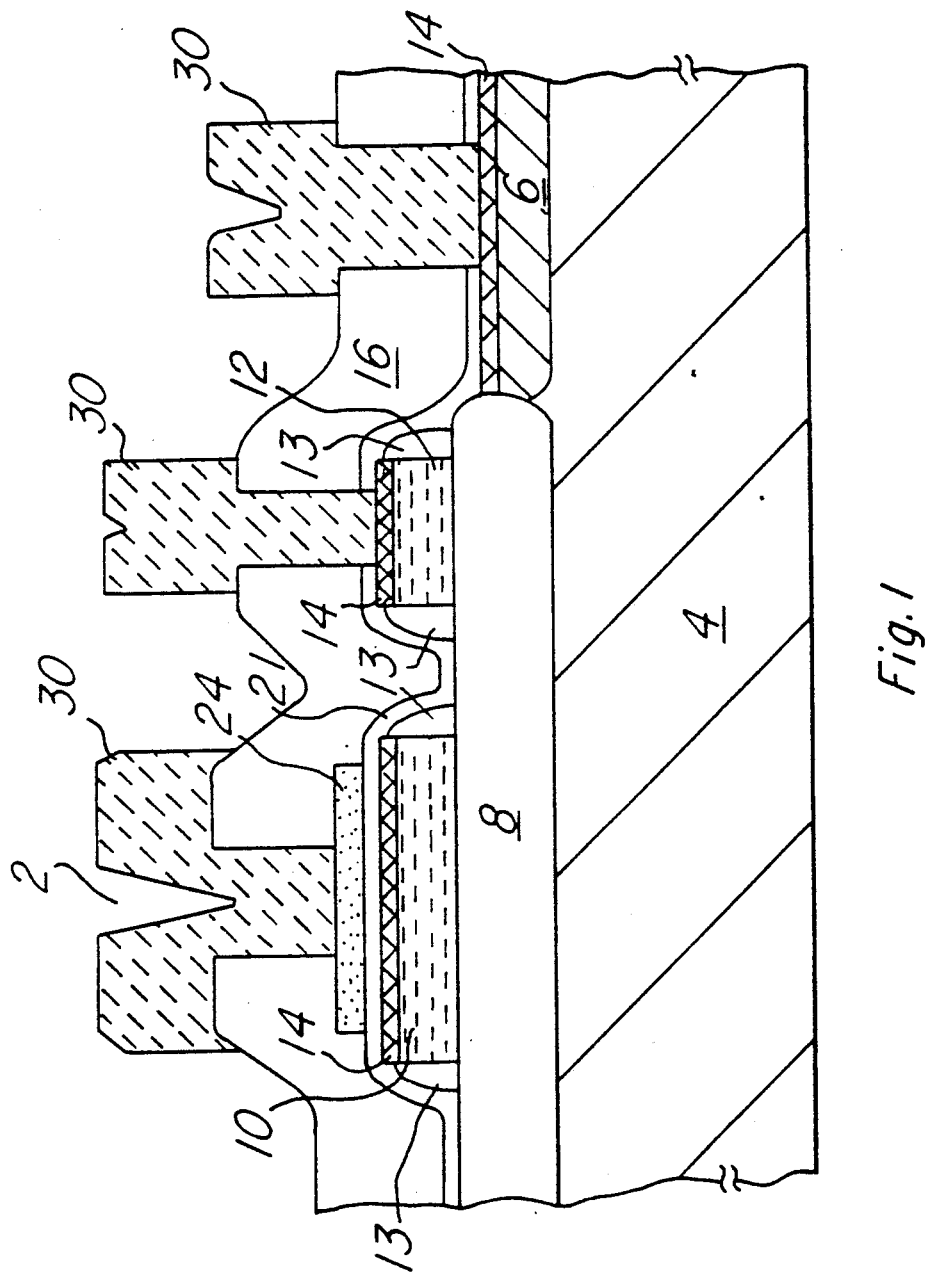
FIG. 1 is a cross-sectional diagram of a completed capacitor constructed according to the preferred embodiment of the invention.

Referring to FIG. 1, a cross-sectional diagram of a metal-to-polysilicon capacitor 2 constructed according to the invention is shown. Capacitor 2 is formed in this embodiment on top of field oxide 8 which is disposed at the surface of p-type substrate 4. Capacitor 2 has a lower plate formed of polycrystalline silicon which, in this embodiment, is clad with a refractory metal silicide 14. Silicide 14 is not essential in the construction of capacitor 2, but may be formed upon polysilicon 10 if silicide cladding is desired for other locations of the integrated circuit containing capacitor 2, as will be described below; such cladding also provides for a lower voltage coefficient for capacitor 2. The capacitor dielectric 21 for capacitor 2 preferably consists of a layer of silicon dioxide having a thickness on the order of 70 nm. Alternatively, other known dielectric material used for integrated circuit capacitors, such as silicon nitride, or multiple layers of silicon dioxide and silicon nitride, may be used. It should be noted that a single layer of silicon dioxide is preferred for capacitor dielectric 21 in high resolution ADCs, since the dielectric relaxation of a single silicon dioxide layer is reduced from that for a silicon dioxide/silicon nitride stack. However, it may be preferable from the standpoint of processing simplicity to use the oxide/nitride stack where dielectric relaxation is less of a concern. By using silicon dioxide or the alternatives, capacitor 2 can be constructed according to the invention to provide a specific capacitance of approximately 1 fF per square micron.

The top plate of capacitor 2 consists of a first metal layer 24, which underlies multilevel dielectric 16. First metal layer 24 can be any metal layer which can be formed according to modern integrated circuit fabrication techniques. Due to its location under multilevel oxide layer 16, it is preferable that first metal layer 24 contain a refractory metal, such as titanium, tungsten, platinum, or other such material. Refractory metal alloys (for example, a titanium-tungsten alloy such as described in U.S. Pat. No. 3,833,842, issued Sep. 3, 1974 and assigned to Texas Instruments Incorporated), or conductive metal compounds (such as refractory metal silicides, or other compounds such as titanium nitride) can also be used. In this preferred embodiment, first metal layer 24 consists of sputtered titanium nitride. Titanium nitride is preferable as first metal layer 24 since it will not react with the underlying capacitor dielectric 21 in subsequent thermal processing steps, such reaction likely to result in degraded integrity for capacitor dielectric 21.

A contact via through multilevel dielectric 16 allows connection between first metal 24 and an aluminum, or aluminum alloy, layer 30. Layer 30 may be alternatively formed of any one of a number of standard metals used in metallization of integrated circuits, such as pure aluminum, doped aluminum (such as copper-doped aluminum and silicon-doped aluminum), or a multi-layer metal system such as one composed of a layer of an alloy of titanium-tungsten underlying a layer of copper-doped aluminum.

It has been found that capacitor 2 having a metal top plate and a silicide-clad polysilicon lower plate, as shown in FIG. 1, has a lower coefficient of capacitance to voltage, than a similarly sized poly-to-poly capacitor. In the case where the lower plate is constructed of unsilicided polysilicon, the voltage coefficient is higher due to the depletion of the polysilicon grains adjacent to the capacitor dielectric as the applied voltage increases, such depletion decreasing the capacitance and in turn increasing the voltage coefficient of the capacitor. As will be further evident hereinbelow in the description of the method used to form capacitor 2, the formation of the dielectric and top plate of capacitor 2 may be done at relatively low temperatures, as compared to the formation of modern poly-to-poly capacitors.

Figure 2C:
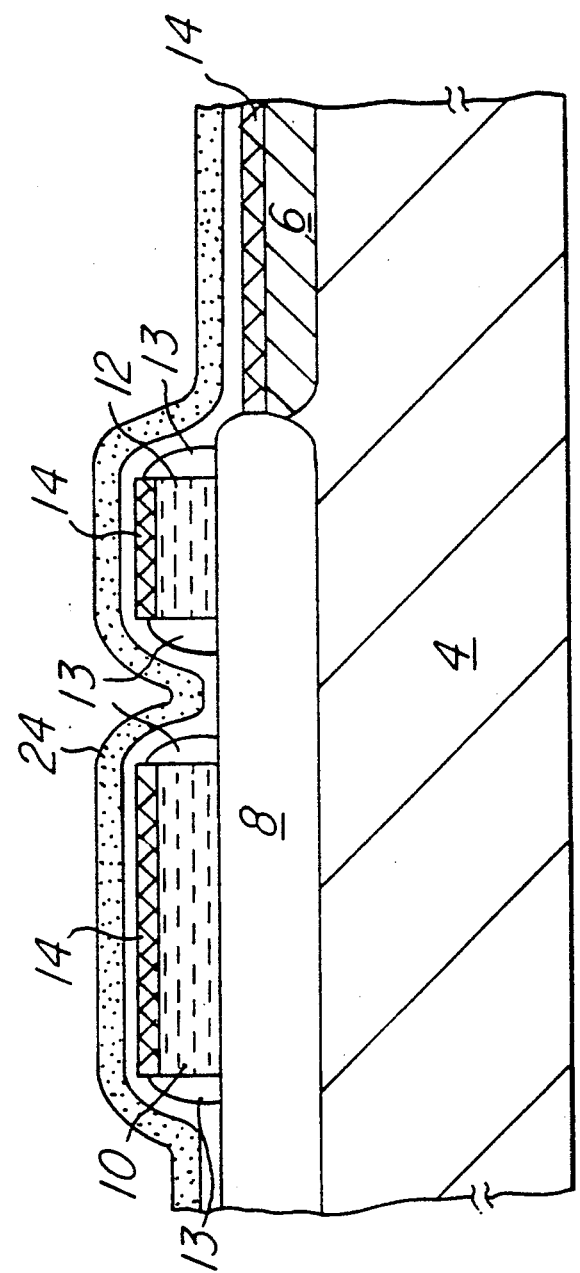

Referring to FIGS. 2a through 2f, a method of forming capacitor 2 of FIG. 1 will be described in detail. FIG. 2a illustrates, in cross-section, a partially fabricated integrated circuit, formed into a p-type substrate 4. Field oxide structures 8 are formed in a manner well known in the art, such as the well known local oxidation (LOCOS) method. A polycrystalline layer is deposited overall, and is patterned and etched to form polysilicon structures 10 and 12. As described above, polysilicon structure 10 will serve as the bottom plate of capacitor 2; polysilicon structure 12 is a structure unrelated to capacitor 2, but is shown here for explanatory purposes. The polysilicon layer used in the formation of structures 10 and 12 is preferably heavily doped so as to be relatively conductive, as in conventional integrated circuits; generally, the polysilicon layer will be doped n-type, and will be either implanted with n-type dopant, or may be in-situ doped during its deposition. N-type diffusion 6 is formed by way of ion implantation and subsequent diffusion into a location of the surface of p-type substrate 4 not covered by field oxide 8; diffusion 6 is generally formed after the formation and patterning of the polysilicon layer described above to form source and drain regions of MOS transistors in self-aligned fashion with the polysilicon gate electrode.

Diffusion 6, and polysilicon structures 10 and 12 in FIG. 2a are each shown clad with a refractory metal silicide film 14. As is well known in the art, it is preferable to form sidewall oxide filaments 13 on the sides of the polysilicon structures 10 and 12 so that the subsequent silicidation does not short out the a polysilicon gate electrode in an MOS transistor to the source and drain diffusions. The silicide film is formed by the deposition of a refractory metal such as titanium, molybdenum, or any refractory metal used in the art for silicide-cladding, followed by annealing to cause the direction reaction of the refractory metal with the underlying silicon to form silicide film 14, such direct react silicidation being well known in the art. The unreacted refractory metal or refractory metal compounds overlying field oxide 8 are subsequently removed, leaving the structure shown in FIG. 2a. As described above, the silicidation of bottom plate polysilicon 10 is not essential but is preferable for a reduced voltage coefficient. As shown in FIGS. 1 and 2a, bottom plate 10 can be silicided simultaneously with polysilicon structure 12 and diffusion 6.

Subsequent to silicidation, capacitor dielectric 21 is deposited over the surface of the integrated circuit, and contacting silicide film 14 at the location at which the capacitor 2 is to be formed, as shown in FIG. 2b. In this embodiment, capacitor dielectric 21, while shown in the Figures as a single layer, preferably consists of a 70 nm thick silicon dioxide layer. Preferably, the silicon dioxide capacitor dielectric is formed way of low pressure chemical vapor deposition, which can be done at relatively low temperatures (for example, on the order of 800 degrees Celsius). After deposition of capacitor dielectric 21 by way of CVD, a densification in an inert or an oxygen atmosphere at a temperature on the order of 800 degrees Celsius may be done. The low temperature of formation of capacitor dielectric by LPCVD reduces additional vertical and lateral diffusion of diffusion 6.

It should be noted that alternative dielectric materials, such as a single layer of thermal silicon dioxide, silicon nitride or a layer of oxidized silicon nitride, may be alternatively used for the dielectric of capacitor 2. An example of a method for forming an oxide/nitride capacitor dielectric 21, also using LPCVD, is described in U.S. Pat. No. 4,697,330, issued Oct. 6, 1987 and assigned to Texas Instruments Incorporated. Additional layers of dielectric material, such as an oxide/nitride/oxide layered dielectric, or a nitride/oxide/nitride layered dielectric as described in copending application Ser. No. 174,751 filed Mar. 29, 1988, may also be alternatively used for the capacitor dielectric.

First metal layer 24 is then formed over the surface of the structure, as shown in FIG. 2c. As noted above, first metal layer 24 can consist of any of the known metal and metal alloys used in conventional integrated circuit fabrication. However, the use of a sputtered film of titanium nitride for first metal layer 24 is believed to be preferable, as such a film will tend not to react with the constituents of underlying capacitor dielectric 21 during subsequent thermal processing, or during the formation of the metal layer 24 itself. An exemplary thickness for first metal layer 24 is on the order of 100 to 200 nm.

Alternatively, titanium nitride formed during the direct reaction of titanium metal in a nitrogen atmosphere may be used for first metal layer 24. As described in U.S. Pat. No. 4,821,085, issued Apr. 11, 1989 and assigned to Texas Instruments Incorporated, titanium nitride forms in locations where the titanium metal is not in contact with silicon, during direct react silicidation. The titanium nitride can be patterned and etched so that local interconnects remain; the top plate of capacitor 2 can be formed by leaving titanium nitride in the desired location. It should be noted that the sputtered titanium nitride is believed to be preferable for the top plate of capacitor 2 over titanium nitride formed by direct reaction in a nitrogen ambient, as the possibility of reaction between titanium metal and the underlying capacitor dielectric 21 is avoided with the sputtered titanium nitride.

Figure 2D:
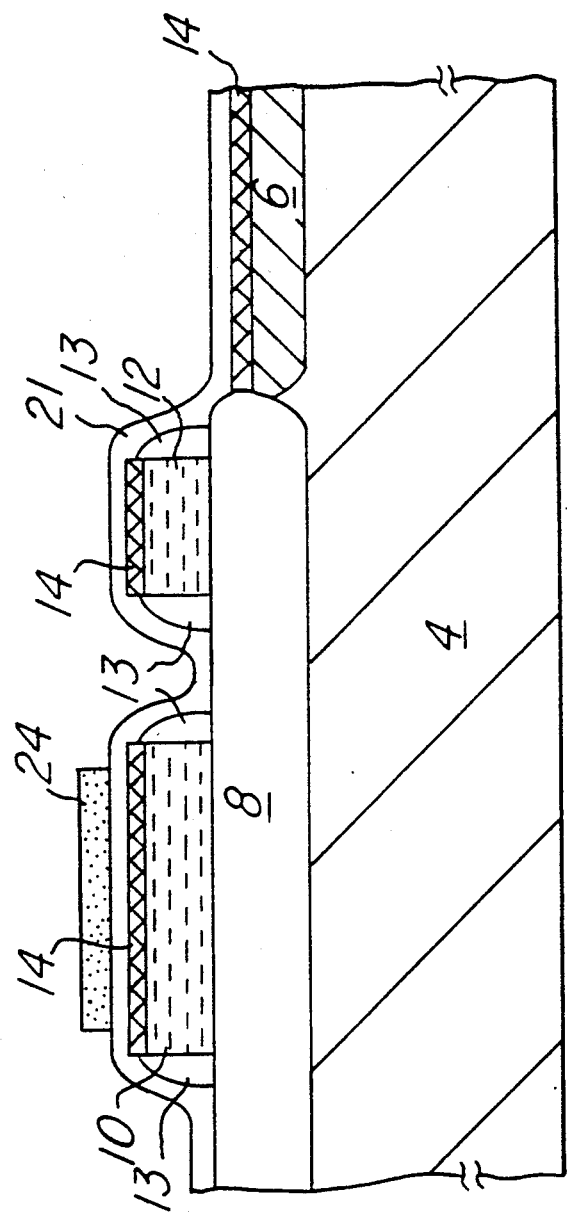
Figure 2E:
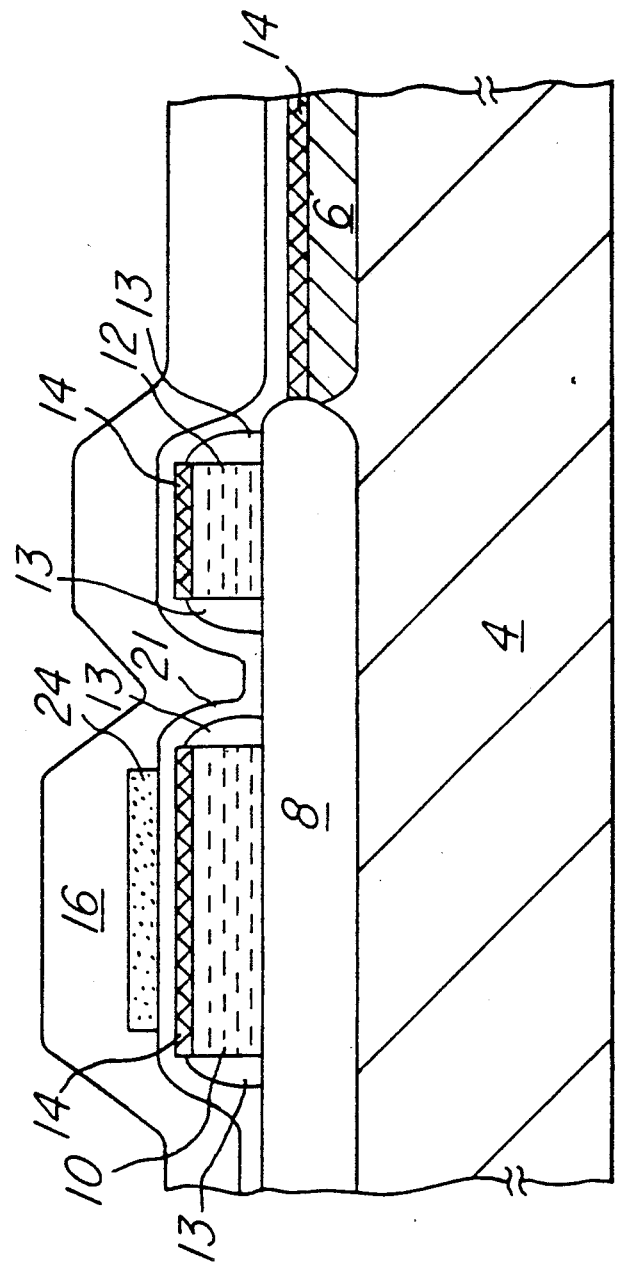

A masking material such as photoresist, or alternatively a hard mask formed of silicon oxide, is then placed over first metal layer 24, and patterned according to known photolithographic techniques, to define the location of the top plate of capacitor 2. First metal layer 24 is then etched, with the masking material in place, to remove the portions thereof which are not to be used for lower plate of capacitor 2, or for other circuit elements (not shown) which can utilize such a layer of metal. A preferred etch for first metal layer 24 formed of titanium nitride (either sputtered or direct react) is a plasma etch using a chlorine-based etchant such as $CCl_4$, as described in U.S. Pat. No. 4,793,896, issued Dec. 27, 1988 and assigned to Texas Instruments Incorporated. After such etch, the resultant structure is as shown in FIG. 2d.

It should be noted that the size of the cross-sectional area of capacitor 2 is defined by the etch of first metal layer 24. In prior methods such as those described in the above-referenced copending applications, the size of capacitor 2 was defined by the size of the contact via through multilevel dielectric 16. However, the ability to control the size of the bottom of a contact via through a thick dielectric such as multilevel dielectric 16 is much reduced from that of defining and etching a metal layer such as first metal layer 24. A primary reason for the improved control of the size of the top plate formed of first metal layer 24 is that first metal layer has a thickness on the order of 100 nm, while multilevel dielectric 16 has a thickness typically on the order of 1 micron. The ability to accurately define the size of the capacitor plate is thus improved due to the relative thicknesses of the films. In addition, since the surface of the structure is less planar after deposition of multilevel dielectric 16 than after deposition of first metal layer 24, the etch of multilevel dielectric 16 is more difficult to control relative to the etch of first metal layer 24. For these reasons, the use of first metal layer 24 to define the size of the capacitor is believed to provide improved control of the capacitor size, and accordingly improved control of an ADC manufactured including such capacitors.

A layer of multilevel dielectric 16 is then deposited, by way of chemical vapor deposition or other conventional methods, over the surface of the integrated circuit, as shown in FIG. 2a. Multilevel 16 may be a conventional dielectric material used for insulation of polysilicon layers from overlying metallization. An example of a conventional multilevel dielectric 16 is phosphorous-doped silicon dioxide (PSG) or boron and phosphorous-doped silicon dioxide (BPSG). Such a multilevel dielectric is doped to provide a getterer for mobile ion contaminants such as sodium, to prevent such contaminants from reaching the underlying active components. It is preferable that LPCVD be used for deposition of multilevel dielectric 16, to prevent damage to capacitor dielectric 21 which may be caused by spiking of first metal layer 24 therethrough in the event of excessive temperature. Conventional LPCVD for multilevel dielectric 16 can be performed on the order of 800 degrees Celsius, such temperature believed to be sufficiently low to minimize damage to capacitor dielectric 21. As noted above, the thickness of multilevel dielectric 16 is on the order of 1 micron.

Vias 18 are then formed through multilevel 16 to top plate 24 at the location where capacitor 2 is to be formed, as shown in FIG. 2f. It should be noted that contacts 18' can also be formed to silicide film 14 (if present, otherwise to polysilicon structure 12 and to diffusion 6) during the same contact etch, if desired. Via 18 is patterned according to conventional photolithography techniques, and etched by conventional wet or plasma etches for the particular material of multilevel 16. It should be noted that the thickness of first metal layer 24 must be sufficient to withstand the etch of the multilevel dielectric 16, and therefore depends upon the selectivity of the oxide etch to the material of the first metal layer 24.

It is common in conventional semiconductor processing to perform a deglaze, consisting of a plasma sputter etch, or a dip of the wafer in hydrofluoric acid, for example, after the etch of contact vias and prior to the deposition of metallization. Such a deglaze clears the structures to which contact is to be made, for example polysilicon 12 and diffusion 6, of any native oxide which may form subsequent to the contact etch and prior to the metallization deposition. The presence of such native oxide will, of course, cause the contacts to become resistive. The type of deglaze used depends upon the material of first metal layer 24, as certain deglazes may attack first metal layer 24 as well as remove the native oxide. Where titanium nitride or a titanium-tungsten alloy is used as first metal layer 24, either a wet deglaze of hydrofluoric acid or a plasma sputter deglaze may be used. It should further be noted that if first metal layer 24 is formed of an aluminum, or doped aluminum layer such as silicon-doped aluminum, the plasma sputter deglaze is preferred.

The structure of FIG. 1 shows the presence of second metal layer 30 making contact to first metal layer 24, as well as to polysilicon 12 and diffusion 6. Metal layer 30 can be any known composition suitable for the formation of integrated circuits. An example of metal layer 30 is an alloy of titanium-tungsten, on the order of 300 nm thick, underlying a layer copper-doped aluminum sputtered to a thickness on the order of 750 nm. It should be noted that the sputtering of second metal layer 30 is generally also done at a relatively low temperature (on the order of 350 degrees Celsius). The thickness of second metal layer 30 is of course sufficient make contact to polysilicon structure 12, and diffusion 6, as well as to first metal layer 24 in the location of capacitor 2. A mask is patterned over second metal layer 30 to define the locations of the metal lines on the integrated circuit, and second metal layer 30 is then etched by a known metal etch. As a result, the structure shown in FIG. 1 is fabricated.

Figure 3:
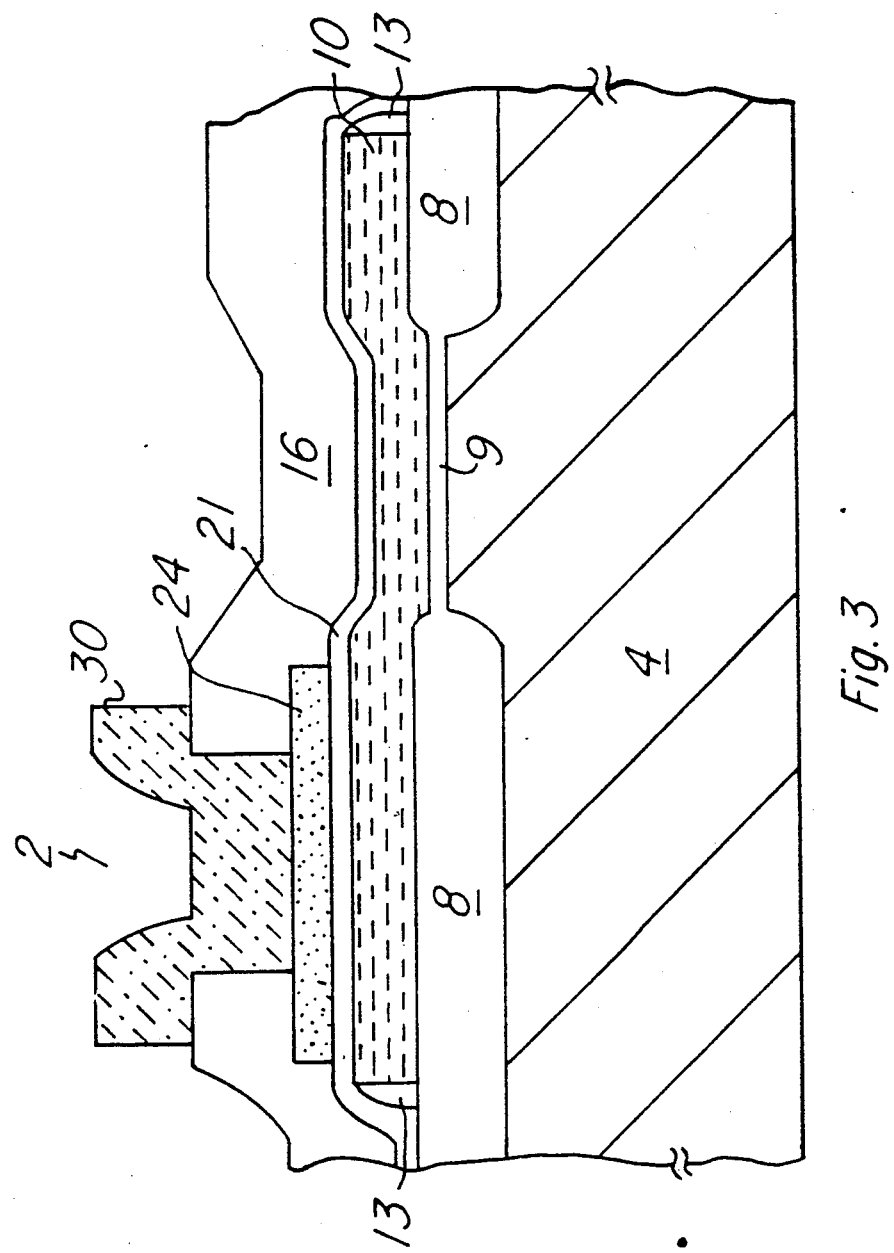
FIG. 3 is a cross-sectional view of a floating-gate transistor constructed according to the invention.
Figure 4:
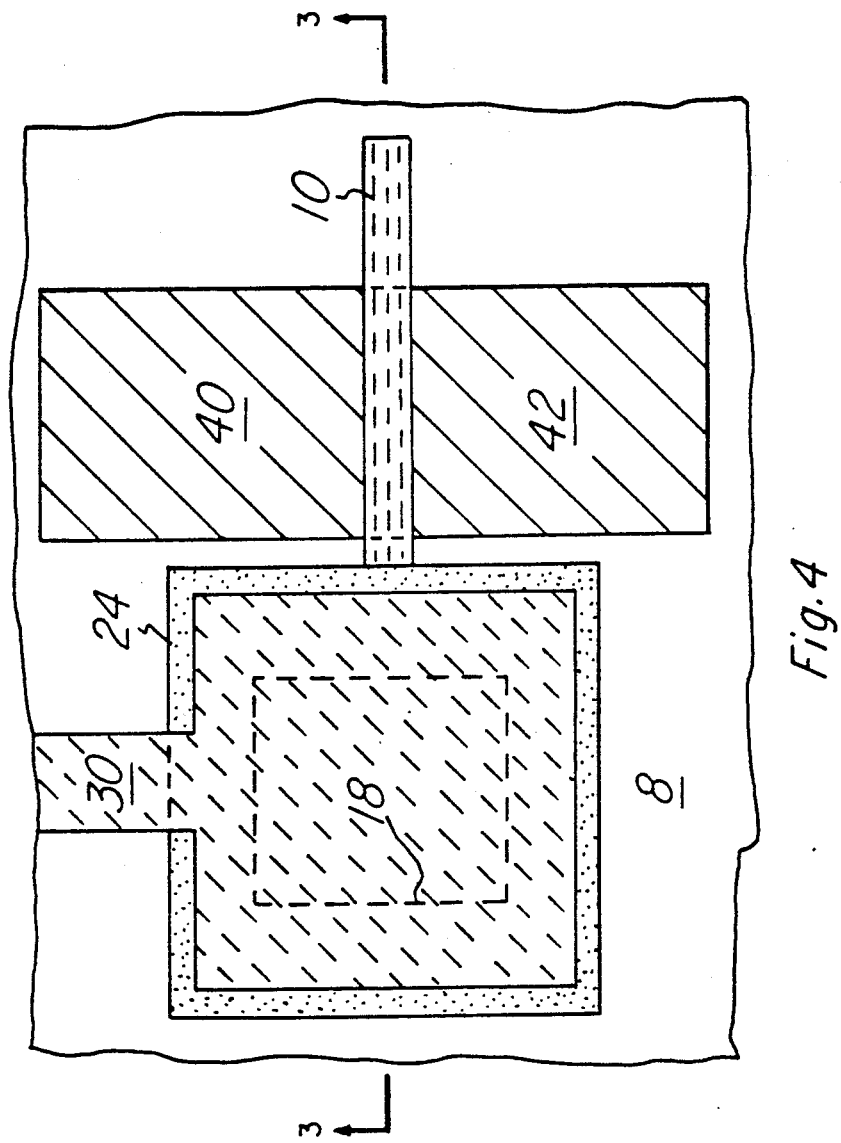
FIG. 4 is a plan view of the floating gate transistor of FIG. 3.

Referring now to FIGS. 3 and 4, a floating-gate transistor is shown incorporating capacitor 2 formed substantially as described hereinabove. The transistor of FIGS. 3 and 4 does not incorporate the formation of silicide film 14 described above; the use of silicide film 14 may of course be used in the transistor of FIGS. 3 and 4, if desired. Like reference numerals are used in FIGS. 3 and 4 as were used in FIGS. 1 and 2a through 2f.

Referring to FIG. 3, capacitor 2 is shown substantially as in FIG. 1. Polysilicon 10, however, extends from under capacitor 2 off the edge of field oxide 8 so as to overlie a thin gate oxide layer 9 in a moat region. As shown in plan view in FIG. 4, polysilicon 10 separates n-type diffusion regions 40 and 42, diffusion 40 serving as the drain of an MOS transistor and diffusion 42 serving as the source. Polysilicon 10 extends onto field oxide 8 on the opposite side of the moat region from capacitor 2, and is electrically isolated. Contact via 18 is shown in phantom in FIG. 4, indicating the location of the connection between second metal layer 30 and first metal layer 24.

The floating gate transistor of FIGS. 3 and 4 thus has polysilicon 10 as the floating gate, and first metal layer 24 (i.e., the top plate of capacitor 2) as the control gate. Capacitor 2 capacitively couples a signal placed on metal layer 30 to polysilicon 10, allowing for the programming and reading of the floating-gate transistor of FIGS. 3 and 4 in the manner conventional for electrically programmable read-only-memory (EPROM) devices and electrically erasable programmable read-only-memory (EEPROM) devices.

Figure 5:
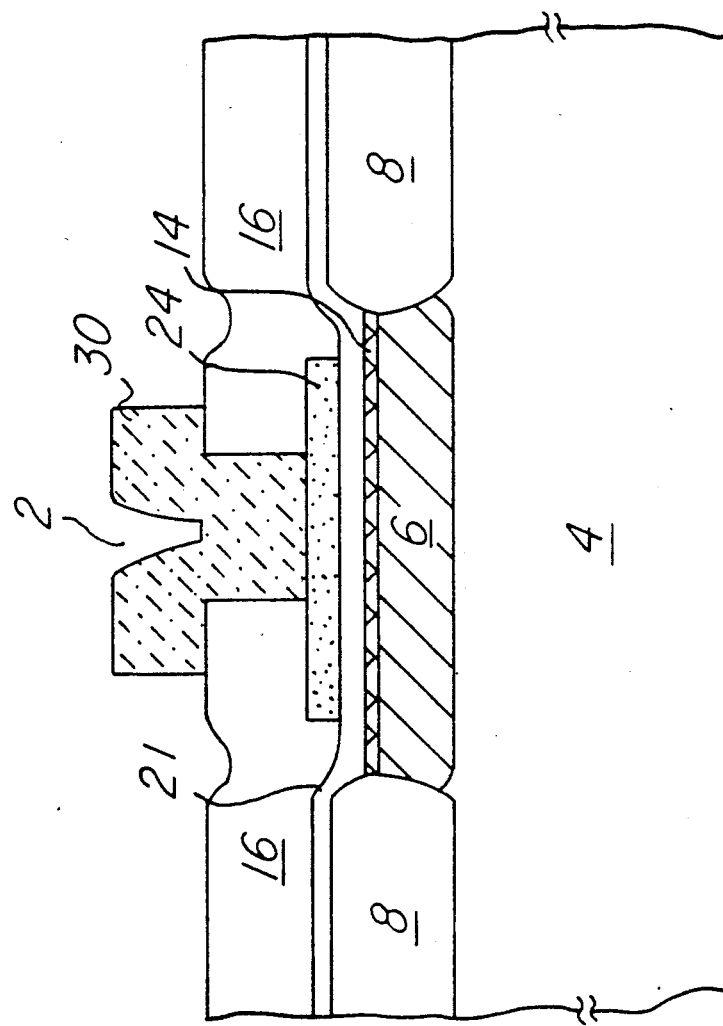
FIG. 5 is a cross-sectional view of another embodiment of a capacitor constructed according to the invention.

Referring now to FIG. 5, another embodiment of a capacitor formed according to the invention is illustrated. In this embodiment, the lower plate of capacitor 2 is formed by a diffusion region 6 which is clad with a refractory metal silicide 14, as described above. Capacitor dielectric 21 is formed over the silicide clad diffusion 6, and first metal layer 24 is formed thereover, as in the prior embodiments, to define the lower plate of the capacitor. Capacitor 2 is then completed in the manner described above, by the deposition of multilevel 16, the etching of a via therethrough to make contact to first metal layer 24, and the deposition and patterning of second metal layer 30. The benefits of defining the size of the capacitor 2 by etching first metal layer 2 are thus applicable to a metal-to-diffusion capacitor, as well as to a metal-to-polysilicon capacitor.

In addition to the silicide-clad polysilicon and diffusion regions described hereinabove, it should be noted that other materials may be used for the bottom plate of the capacitor. For example, where other materials such as refractory metals are used for formation of the transistor gate electrodes, such alternative gate material may also be used to form the bottom plate of the capacitor.

Subsequent to the completion of the capacitors described herein, connections may be made to bond pads formed of second metal layer 30 near the edges of the chip, or to bond pads formed of additional metal layers, according to conventional methods. Individual chips are then separated from portions of substrate 4, and external connections made thereto by way of wire bonding, direct bump connection, or the like, as is well known in the art. The individual circuits may then be packaged into a dual-in-line package, a ship carrier, or another type of package. An example of such a package is described in U.S. Pat. No. 4,495,376 issued Jan. 22, 1985 and assigned to Texas Instruments Incorporated.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A method for fabricating a capacitor at a surface of a semiconductor body, comprising the steps of:
   forming a bottom plate comprising silicon on said surface;
   forming a capacitor dielectric over said bottom plate;
   forming a first layer wherein said first layer is selected from the group consisting of a metal layer, a metallic compound layer, and an alloy layer overlying said capacitor dielectric;
   removing selected portions of said first layer to define a top plate overlying said capacitor dielectric and said bottom plate;

forming, after the above steps a multilevel dielectric layer of a relative thickness of ten to one as compared with said first layer, overall; removing a portion of said multilevel dielectric layer over said top plate to expose a portion thereof; and forming a second metal layer in contact with said top plate wherein said multilevel dielectric layer isolates said second metal layer from said bottom plate.

2. The method of claim 1, further comprising:
forming a field dielectric structure at said surface;
wherein said step of forming a bottom plate comprises forming a polycrystalline silicon layer over said field dielectric structure.

3. The method of claim 2, further comprising:
forming a metal silicide film over said bottom plate.

4. The method of claim 1, further comprising:
forming a metal silicide film over said bottom plate.

5. The method of claim 1, wherein said step of forming a first layer comprises sputtering titanium nitride over said capacitor dielectric.

6. The method of claim 1, wherein said step of forming a first layer comprises:
forming a layer of titanium overall; and
heating the structure in a nitrogen ambient so that said titanium reacts with said nitrogen to form titanium nitride.

7. The method of claim 1, wherein said first layer comprises an alloy of titanium and tungsten.

8. The method of claim 1, wherein said multilevel dielectric layer comprises phosphorous-doped silicon dioxide.

9. The method of claim 1, wherein said multilevel dielectric layer comprises boron and phosphorous-doped silicon dioxide.

* * * * *